(12) United States Patent
Song et al.

(10) Patent No.: US 8,183,919 B2
(45) Date of Patent: May 22, 2012

(54) POWER AMPLIFIER

(75) Inventors: Young Jean Song, Gyunggi-do (KR); Shinichi Iizuka, Gyunggi-do (KR); Youn Suk Kim, Gyunggi-do (KR); Hyo Kun Bae, Seoul (KR); Sang Hee Kim, Gyunggi-do (KR); Jun Goo Won, Gyunggi-do (KR); Joong Jin Nam, Seoul (KR); Ki Joong Kim, Gyunggi-do (KR); Jae Hyouck Choi, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 12/823,489

(22) Filed: Jun. 25, 2010

(65) Prior Publication Data

US 2011/0121903 A1    May 26, 2011

(30) Foreign Application Priority Data

Nov. 23, 2009  (KR) .................. 10-2009-0113233

(51) Int. Cl.
    *H03F 3/45* (2006.01)
(52) U.S. Cl. ........................ 330/253; 330/165
(58) Field of Classification Search .................. 330/165, 330/253, 276, 277, 301, 302, 310, 98, 150, 330/195

See application file for complete search history.

(56) References Cited

U.S. PATENT DOCUMENTS

| 6,725,030 | B2 | 4/2004 | Vathulya |
| 6,788,142 | B2* | 9/2004 | Li et al. .................. 330/253 |
| 2007/0057726 | A1 | 3/2007 | Kim |
| 2010/0148869 | A1* | 6/2010 | Kawakami et al. .......... 330/255 |

FOREIGN PATENT DOCUMENTS

| KR | 1020030061697 A | 7/2003 |
| KR | 1020050057927 A | 6/2005 |
| KR | 10 2007 0024765 A | 3/2007 |

OTHER PUBLICATIONS

Korean Office Action for Application No. 10-2009-0113233, issued Feb. 24, 2011.
Korean Office Action issued on Oct. 26, 2011 in corresponding Korean Patent Application No. 20-2009-01113233.

* cited by examiner

*Primary Examiner* — Khanh Nguyen

(74) *Attorney, Agent, or Firm* — Lowe, Hauptman, Ham & Berner, LLP

(57) ABSTRACT

A power amplifier includes an inverter amplification section configured to amplify AC components and remove DC components from at least one input signal, an impedance matching section configured to match an impedance of a transmission path of the at least one input signal amplified by the inverter amplification section, and an amplification section configured to amplify an impedance-matched signal from the impedance matching section according to a predetermined gain. The inverter amplification section includes at least one P-channel metal-oxide semiconductor field effect transistor (MOS FET) having a gate configured to receive the at least one input signal and at least one N-channel MOS FET having a gate configured to receive the at least one input signal. The at least one P-channel MOS FET and the at least one N-channel MOS FET are serially connected.

20 Claims, 5 Drawing Sheets

POWER AMPLIFIER

CROSS-REFERENCE TO RELATED APPLICATIONS

This application claims the priority of Korean Patent Application No. 2009-0113233 filed on Nov. 23, 2009, in the Korean Intellectual Property Office, the disclosure of which is incorporated herein by reference.

BACKGROUND OF THE INVENTION

1. Field of the Invention

The present invention relates to power amplifiers, and more particularly, to a power amplifier that can increase power efficiency by preventing power consumption caused by DC components from an RF input signal.

2. Description of the Related Art

Mobile communications terminals have been widely used because they are easy to use. As the use of these mobile communications terminals has increased, it has become important to run various kinds of applications to meet consumer demand and allow for long-time use at the same time.

In order to extend the use time of a mobile communications terminal, it is important to increase battery capacity. However, the size of batteries is limited since small, lightweight, and thin mobile communications terminals are in demand in the market. Therefore, there is a need to increase the power efficiency of main elements inside a mobile communications terminal.

In order to transmit and receive RF signals, this mobile communications terminal uses a power amplifier. This power amplifier takes up a considerable portion of the overall power consumption of the mobile communication terminal.

Thus, the power efficiency of the power amplifier needs to be increased. However, as for a power amplifier being used in a mobile communications terminal according to the related art, DC current flows through the power amplifier at all times, which reduces power efficiency.

SUMMARY OF THE INVENTION

An aspect of the present invention provides a power amplifier that can increase power efficiency by preventing power consumption caused by DC components from an RF input signal.

According to an aspect of the present invention, there is provided a power amplifier including: an inverter amplification section configured to amplify AC components and remove DC components from at least one input signal; an impedance matching section configured to match an impedance of a transmission path of the input signal amplified by the inverter amplification section; and an amplification section configured to amplify an impedance-matched signal from the impedance matching section according to a gain set beforehand. The inverter amplification section includes at least one P-channel metal-oxide semiconductor field effect transistor (MOS FET) having a gate configured to receive the at least one input signal and at least one N-channel MOS FET having a gate configured to receive the at least one input signal, where the at least one P-channel MOS FET and the at least one N-channel MOS FET are serially connected.

The input signal may include balanced signals including an input signal having a positive level and an input signal having a negative level.

The inverter amplification section may include: a first inverter including a first P-channel MOS FET (metal-oxide-semiconductor field-effect transistor) having a drain receiving driving power, a gate receiving the input signal having the positive level, and a source connected to the impedance matching section, and a first N-channel MOS FET having a drain connected to the impedance matching section, connected to the source of the first P-channel MOS FET, a gate receiving the input signal having the positive level, and a source connected to a ground; and a second inverter including a second P-channel MOS FET having a drain being supplied with the driving power, a gate receiving the input signal having the negative level, and a source connected to the impedance matching section, and a second N-channel MOS FET having a drain connected to the impedance matching section, connected to the source of the P-channel MOS FET, a gate receiving the input signal having the negative level, and a source connected to a ground.

The impedance matching section may include: a first primary coil having one end receiving operating power and the other end connected to the source of the first P-channel MOS FET and the drain of the first N-channel MOS FET, the first primary coil receiving the amplified input signal having the positive level from the first inverter; a second primary coil having one end receiving the operating power and the other end connected to the source of the second P-channel MOS FET and the drain of the second N-channel MOS FET, the second primary coil receiving the amplified input signal having the negative level from the second inverter; a first secondary coil having one end receiving the operating power and the other end connected to the amplification section, the first secondary coil electromagnetically coupled with the first primary, and receiving the input signal having the positive level from the second primary coil to transmit the received input signal to the amplification section; and a second secondary coil having one end receiving the operating power and the other end connected to the amplification section, the second secondary coil electromagnetically coupled with the second primary coil and receiving the input signal having the positive level from the second primary coil to transmit the received input signal to the amplification section.

The amplification section may include a third N-channel MOS FET having a drain being supplied with the driving power, a gate receiving the input signal having the positive level from the other end of the first secondary coil, and a source connected to the ground, the third N-channel MOS FET amplifying the input signal having the positive level from the impedance matching section according to a gain set beforehand to thereby output the amplified input signal having the positive level; and a fourth N-channel MOS FET having a drain being supplied with the driving power, a gate receiving the input signal having the negative level from the other end of the second secondary coil, and a source connected to the ground, the N-channel MOS FET amplifying the input signal having the negative level from the impedance matching section according to a gain set beforehand to thereby output the amplified input signal having the negative level.

The power amplifier may further include an intermediate amplification section re-amplifying the input signals amplified by the inverter amplification section according to gains set beforehand, and transmitting the input signals being re-amplified to the impedance matching section.

The intermediate amplification section may include a first cascade amplification unit and a second cascade amplification unit each being supplied with the driving power from a driving power terminal, connected in parallel with each other, and receiving the input signal having the positive level and the input signal having the negative level from the inverter amplification section, respectively; and a first cascode amplification unit and a second cascode amplification unit connected in series between the first and second cascade amplification units and a ground terminal, connected in parallel with each other, and receiving the input signal having the positive level and the input signal having the negative level from the inverter amplification section, respectively, the first and second cascade amplification units may include third and fourth P-channel MOS FETs, respectively, while a gate of the third P-channel MOS FET receives the input signal having the positive level or the input signal having the negative level from the inverter amplification section, the gate of the third P-channel MOS FET being connected to that of the fourth P-channel MOS FET, and the first and second cascode amplification units may include third and fourth N-channel MOS FETs, respectively, while a gate of the third N-channel MOS FET receives the input signal having the positive level or the input signal having the negative level from the inverter amplification section, the gate of the fourth N-channel MOS FET being connected in common to that of the fourth N-channel MOS FET.

The impedance matching section may include a primary coil having one end electrically connected to a connection terminal between the first cascade amplification unit and the first cascode amplification unit and the other end electrically connected to a connection terminal between the second cascade amplification unit and the second cascode amplification unit, the primary coil receiving the input signal being re-amplified by the intermediate amplification section; and a secondary coil electromagnetically coupled with the primary coil and receiving the input signal being re-amplified from the primary coil.

The amplification section may include a third cascode amplification unit and a fourth cascode amplification unit connected in series between the driving power terminal and ground and connected in parallel with each other, the third and fourth cascode amplification units may include fifth and sixth N-channel MOS FETs, respectively, and a gate of the fifth N-channel MOS FET may receive an external gain control signal while a gate of the sixth N-channel MOS FET may receive the input signal having the positive level or the input signal having the negative level from the secondary coil of the impedance matching section.

The power amplifier may further include an intermediate amplification section re-amplifying the input signals, amplified by the inverter amplification section, according to gains set beforehand, and transmitting the re-amplified input signals to the impedance matching section.

The inverter amplification section may include a first inverter and a second inverter connected in series with each other between a driving power terminal supplying the driving power and ground, the first and second inverters each amplifying the input signal having the positive level according to an inverter method, and a third inverter and a fourth inverter connected in series between the driving power terminal and ground, and amplifying the input signal having the negative level according to an inverter method, the first inverter may include a first P-channel MOS FET having a drain being supplied with the driving power, a gate receiving the input signal having the positive level, and a source connected to the impedance matching section, while the second inverter may include a first N-channel MOS FET having a drain connected to the impedance matching section, connected to the source of the first P-channel MOS FET, a gate receiving the input signal having the positive level, and a source connected to a ground, and the third inverter may include a second P-channel MOS FET having a drain being supplied with the driving power, a gate receiving the input signal having the negative level, and a source connected to the impedance matching section, and the fourth inverter may include a second N-channel MOS FET having a drain connected to the impedance matching section, connected to the source of the second P-channel MOS FET, a gate receiving the input signal having the negative signal, and a source connected to the ground.

The intermediate amplification section may include a first cascade amplification unit and a second cascade amplification unit each being supplied with the power terminal from a driving power terminal supplying the driving power, connected in parallel with each other, and receiving the input signal having the positive level and the input signal having the negative level from the inverter amplification section, respectively, and the first and second cascade amplification units may include third and fourth P-channel MOS FETs, respectively, while a gate of the third P-channel MOS FET receives the input signal having the positive level or the input signal having the negative level from the inverter amplification section, the gate of the third P-channel MOS FET being connected in common to that of the fourth N-channel MOS FET, and the first and second cascade amplification units may include third and fourth N-channel MOS FETs, respectively, while a gate of the third N-channel MOS FET receives the input signal having the positive level or the input signal having the negative level from the inverter amplification section, the gate of the third N-channel MOS FET being connected in common to that of the fourth N-channel MOS FET.

The impedance matching section may include a primary coil having one end electrically connected to a connection terminal between the first cascade amplification unit and the first cascade amplification unit and the other end electrically connected to a connection terminal between the second cascade amplification unit and the second cascade amplification unit, the primary coil receiving the input signals re-amplified by the intermediate amplification section; and a secondary coil electromagnetically coupled with the primary coil and receiving the input signals being re-amplified from the primary coil.

The amplification section may include a third cascode amplification unit and a fourth cascode amplification unit connected in series with the driving power terminal and ground and connected in parallel with each other, the third and fourth cascode amplification units may include fifth and sixth N-channel MOS FETs, respectively, and a gate of the fifth N-channel MOS FET may include an external gain control signal while a gate of the sixth N-channel MOS FET may receive the input signal having the positive level or the input signal having the negative level from the secondary coil of the impedance matching section.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
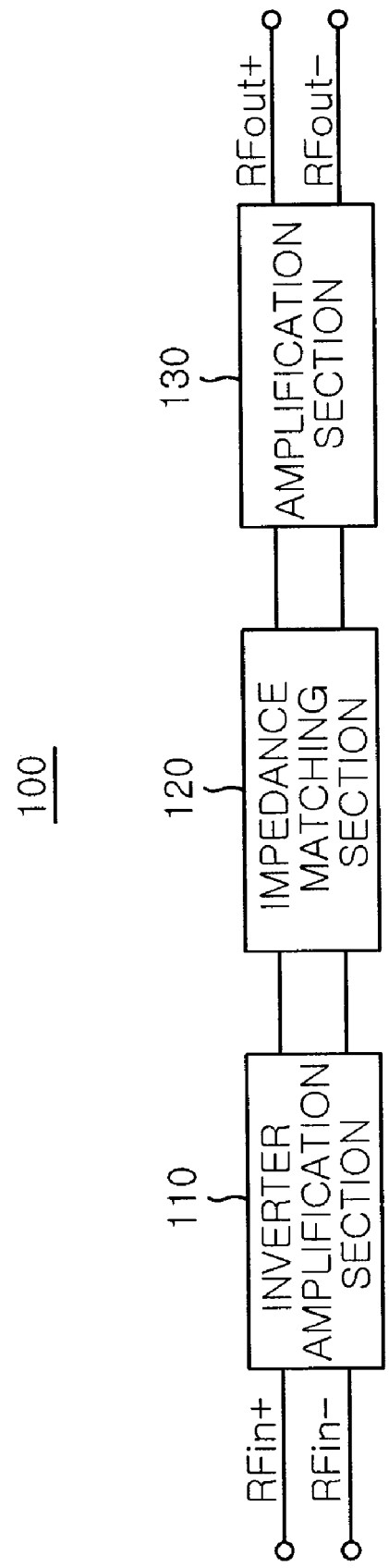
FIG. 1 is a schematic view illustrating the configuration of a power amplifier according to an exemplary embodiment of the present invention.

FIG. 1 is a schematic view illustrating the configuration of a power amplifier according to an exemplary embodiment of the invention.

Referring to FIG. 1, a power amplifier 100 according to this embodiment may include an inverter amplification section 110, an impedance matching section 120, and an amplification section 130.

The inverter amplification section 110 may amplify an RF input signal according to an inverter method to thereby remove DC components therefrom.

The impedance matching section 120 matches the impedance of a transmission path of the RF input signal, amplified by the inverter amplification section 110, to thereby transmit an impedance-matched signal to the amplification section 130.

The amplification section 130 amplifies the impedance-matched signal from the impedance matching section 120 according to a gain set beforehand to thereby output the impedance-matched signal being amplified.

Figure 2:
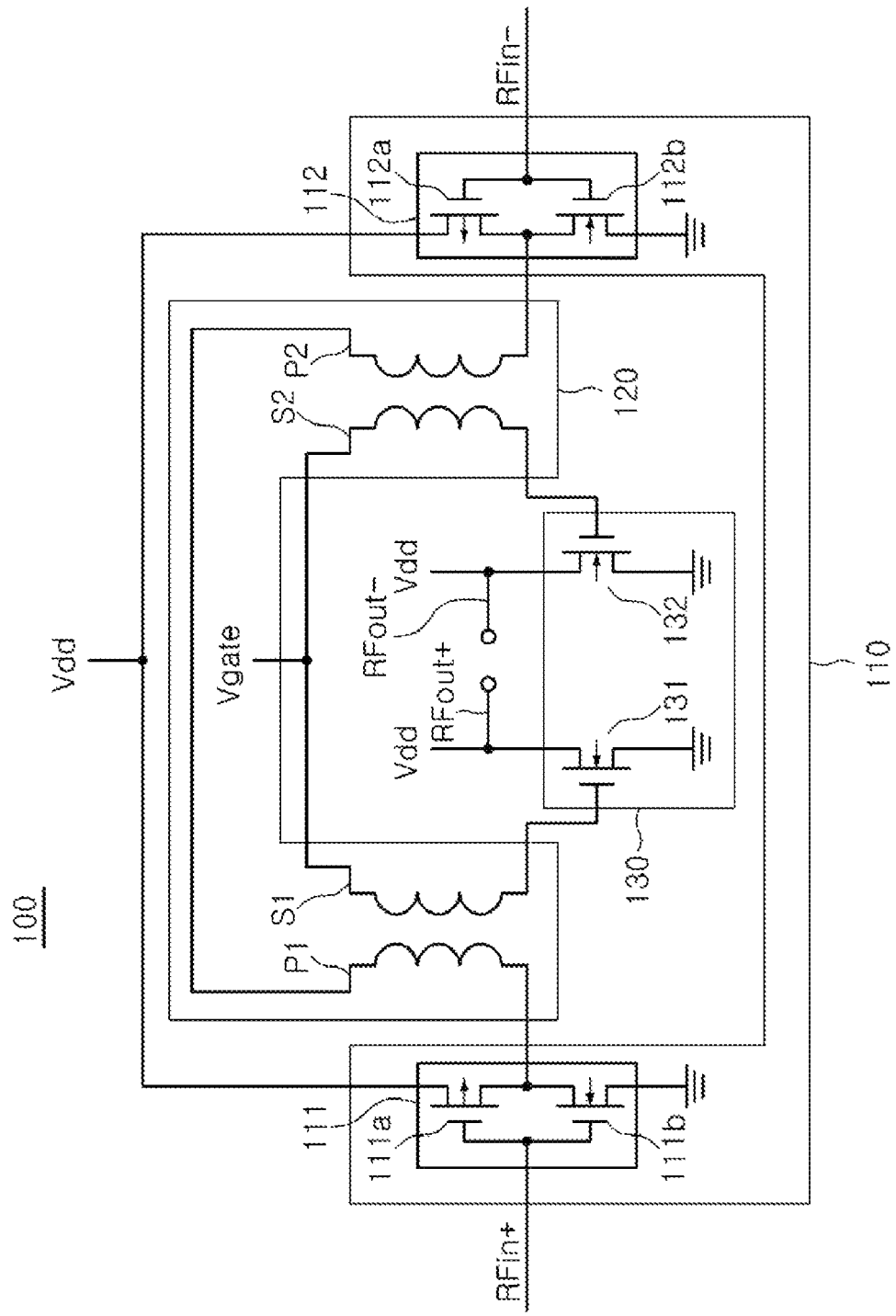
FIG. 2 is a schematic circuit diagram illustrating the power amplifier as shown in FIG. 1.

FIG. 2 is a schematic circuit diagram illustrating the power amplifier as shown in FIG. 1.

Referring to FIGS. 1 and 2, the inverter amplification section 110, which is included in the power amplifier 100 according to this embodiment, may include first and second inverters 111 and 112.

The first inverter 111 may include a first P-channel MOS FET 111a and a first N-channel MOS FET 11b, which are connected in series with each other between a driving power terminal supplying driving power Vdd and a ground.

The first P-channel MOS FET 111a has a drain being supplied with the driving power Vdd, a gate receiving an input signal RFin+ having a positive level between RF input signals, and a source connected to the first N-channel MOS FET 11b.

The first N-channel MOS FET 11b has a drain connected to the source of the first P-channel MOS FET 111a, a gate receiving the input signal RFin+ having a positive level, and a source connected to a ground.

As described above, the first inverter 111 amplifies the input signal RFin+ having a positive level to thereby output an amplified output signal. The amplified output signal is output through a connection terminal between the first P-channel MOS FET 111a and the first N-channel MOS FET 11b. Therefore, the phase of the input signal RFin+ may be shifted such that the output signal has an inverse phase to the phase thereof on the basis of 0V. Therefore, while DC components, included in the input signal RFin+, are removed, AC components can be amplified.

Similarly, the second inverter 112 may include a second P-channel MOS FET 112a and a second N-channel MOS FET 112b that are connected in series between the driving power terminal and ground. Like the configuration of the first inverter 111, the second P-channel MOS FET 112a has a drain being supplied with the driving power Vdd, a gate receiving an input signal RFin− having a negative level between RF input signals, and a source connected to the second N-channel MOS FET 112b. The second N-channel MOS FET 112b has a drain connected to the source of the second P-channel MOS FET 112a, a gate receiving the input signal RFin− having a negative level, and a source connected to a ground.

In the same manner, the second inverter 112 removes DC components, included in the input signal RFin−, and amplifies AC components to thereby transmit an amplified output signal to the impedance matching section 120.

The impedance matching section 120 may include a first primary coil P1, a second secondary coil P2, a first secondary coil S1, and a second secondary coil S2. The first primary coil P1 receives the amplified output signal from the first inverter 111. The second secondary coil P2 receives the amplified output signal from the second inverter 112. The first secondary coil S1 performs the impedance matching of the amplified output signal according to a turns ratio, determined by electromagnetic coupling between the first primary and secondary coils P1 and S1, to thereby transmit the impedance-matched signal to the amplification section 130. The second secondary coil S2 performs the impedance matching of the amplified output signal according to a turns ratio, determined by electromagnetic coupling between the second primary and secondary coils P2 and S2 to thereby transmit the impedance-matched signal to the amplification section 130.

One end of the first primary coil P1 is electrically connected to the second primary coil P2, and the other end of the first primary coil P1 is electrically connected to the connection terminal between the first P-channel MOS FET 111a and the first N-channel MOS FET 11b of the first inverter 111, so that the first primary coil P1 can receive the output signal, obtained by amplifying the input signal RFin+ having a positive level, from the first inverter 111.

One end of the second primary coil P2 is electrically connected to one end of the first primary coil P1, and the other end of the second primary coil P2 is connected to a connection terminal between the second P-channel MOS FET 112a and the second N-channel MOS FET 112b of the second inverter 112, so that the second primary coil P2 can receive the output signal, obtained by amplifying the input signal RFin− having a negative level, from the second inverter 112.

One end of the first secondary coil S1 receives operating power Vgate, and the other end thereof is electrically connected to the amplification section 130, so that the first secondary coil S1 can transmit the impedance-matched signal to the amplification section 130. One end of the second secondary coil S2 receives the operating power Vgate, and the other end thereof is electrically connected to the amplification section 130, so that the second secondary coil S2 can transmit the impedance-matched signal to the amplification section 130.

The amplification section 130 may include a third N-channel MOS FET 131 and a fourth N-channel MOS FET 132. The third and fourth N-channel MOS FETs 131 and 132 are connected in series between the driving power terminal and a ground and are connected in parallel with each other.

The third N-channel MOS FET 131 has a drain being supplied with the driving power Vdd, a gate receiving one of the impedance-matched signals, which has a positive level, from the impedance matching section 120, and a source connected to the ground.

The fourth N-channel MOS FET 132 has a drain being supplied with the driving power Vdd, a gate receiving the other one having a negative level from the impedance matching section 120, and a source connected to the ground.

Therefore, the amplification section 130 can amplify the impedance-matched signals with positive and negative levels from the impedance matching section 120, separately, according to respective gains set beforehand to thereby output amplified signals.

Figure 3:
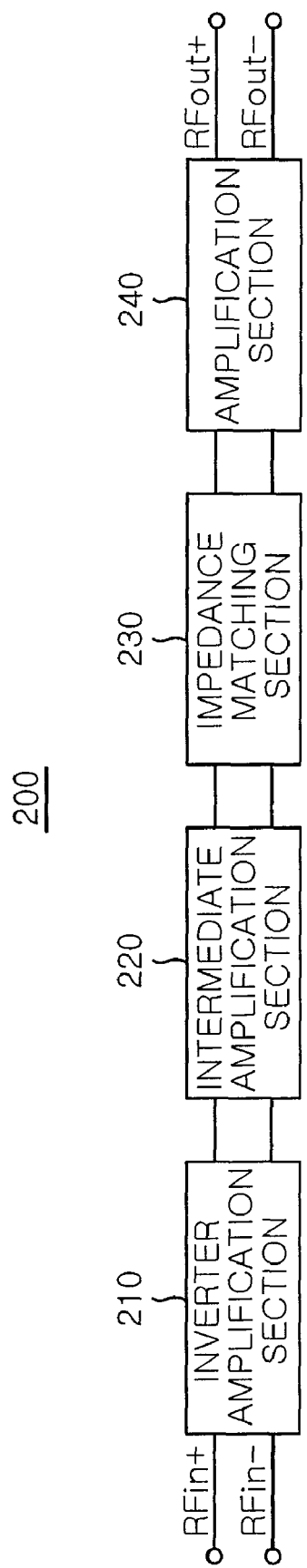
FIG. 3 is a schematic view illustrating the configuration of a power amplifier according to another exemplary embodiment of the present invention.

FIG. 3 is a schematic view illustrating the configuration of a power amplifier according to another exemplary embodiment of the invention.

Referring to FIG. 3, a power amplifier 200 according to this embodiment may include an inverter amplification section 210, an intermediate amplification section 220, an impedance matching section 230, and an amplification section 240.

The intermediate amplification section 220 may re-amplify signals, amplified by the inverter amplification section 210, according to a gain set beforehand.

The functions of the inverter amplification section 210, the impedance matching section 230, and the amplification section 240 are similar with those of the inverter amplification section 110, the impedance matching section 120, and the amplification section 130 as described in FIG. 1. Thus, a detailed description thereof will be omitted.

Figure 4:
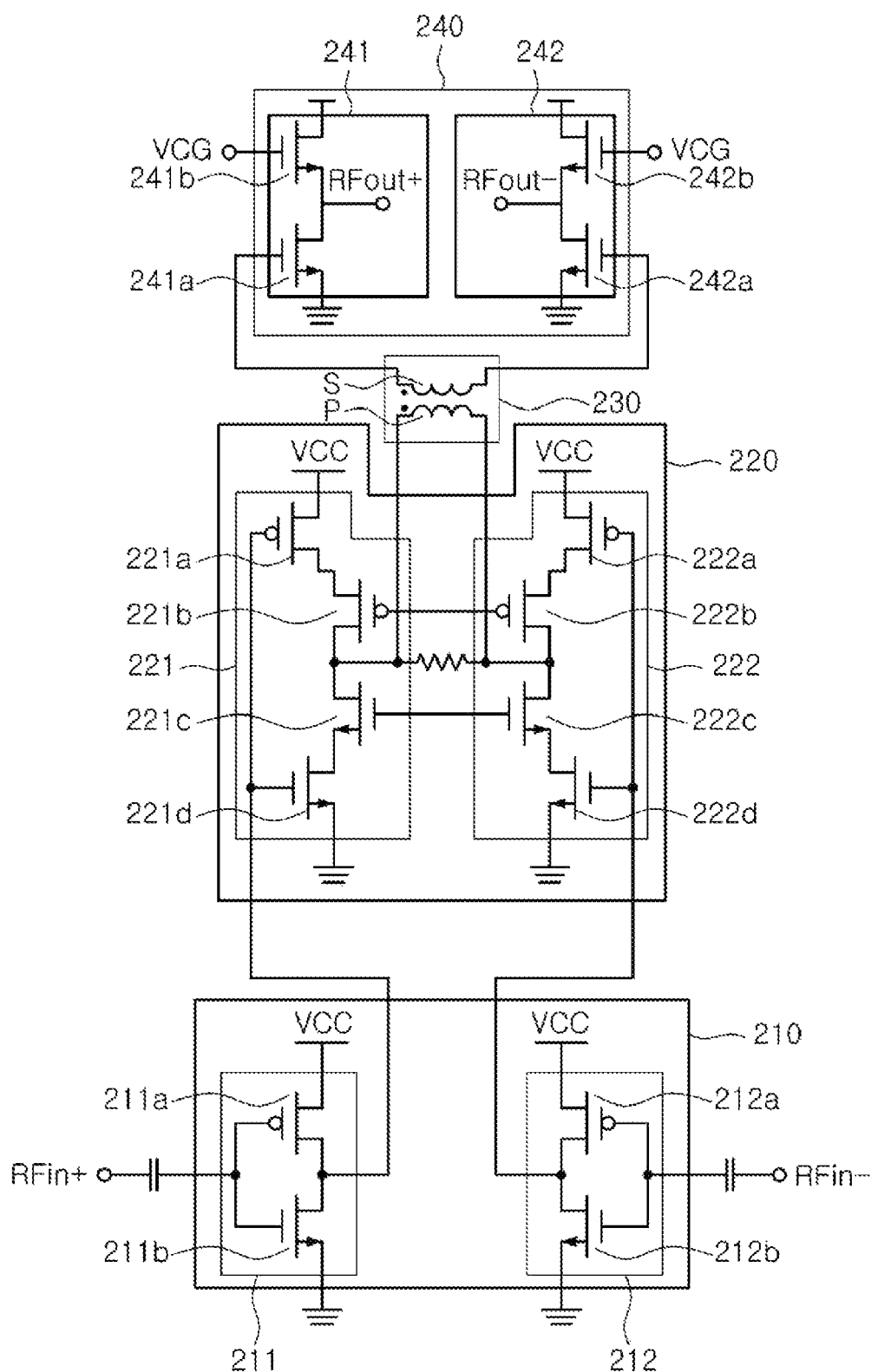
FIG. 4 is a schematic circuit diagram illustrating the power amplifier as shown in FIG. 3.

FIG. 4 is a schematic circuit diagram illustrating the power amplifier as shown in FIG. 4.

Referring to FIG. 4, the configurations of first and second P-channel MOS FETs 211a and 212a, included in the first inverter 211, and first and second N-channel MOS FETs 211b and 212b, included in the second inverter 212, of the inverter amplification section 210 are the same as those of the inverter amplification section 110. Thus, a detailed description thereof will be omitted.

The intermediate amplification section 220 may include first and second amplification units 221 and 222 that re-amplify signals having positive and negative levels, respectively, which are amplified by the inverter amplification section 210.

The first amplification unit 221 may include first cascade amplification units 221a and 221b and first cascode amplification units 221c and 221d that are connected in series between a driving power terminal supplying driving power Vcc and ground. The second amplification unit 222 may include second cascade amplification units 222a and 222b and second cascode amplification units 222c and 222d that are connected in series between the driving power terminal and ground.

The first cascade amplification units 221a and 221b may include third and fourth P-channel MOS FETs 221a and 221b, respectively, which are arranged in cascade configuration. The first cascode amplification units 221c and 221d may include third and fourth N-channel MOS FETs 221c and 221d, respectively, which are arranged in cascode configuration.

The second cascade amplification units 222a and 222b may include fifth and sixth P-channel MOS FETs 222a and 222b, respectively, which are arranged in cascade configuration. The second cascode amplification units 222c and 222d may include fifth and sixth N-channel MOS FETs 222c and 222d, respectively, which are arranged in cascode configuration.

Since the above-described cascade configuration and cascode configuration are known in the art, a detailed description thereof will be omitted.

However, while one with a positive signal between the signals amplified by the inverter amplification section 210, may be input to a gate of the third P-channel MOS FET 221a of the first cascade amplification units 221a and 221b and a gate of the fourth N-channel MOS FET 221d of the first cascode amplification units 221c and 221d, the other signal with a negative signal between the signals, amplified by the inverter amplification section 210, may be input to a gate of the fifth P-channel MOS FET 222a of the second cascade amplification units 222a and 222b and a gate of the sixth N-channel MOS FET 222d of the second cascode amplification units 222c and 222d.

Furthermore, while a gate of the fourth P-channel MOS FET 221b of the first cascade amplification units 221a and 221b and a gate of the sixth P-channel MOS FET 222b of the second cascade amplification units 222a and 222b may be connected in common to each other, a gate of the third N-channel MOS FET 221c of the first cascode amplification units 221c and 221d and a gate of the fifth N-channel MOS FET 222c of the second cascode amplification units 222c and 222d may be connected in common to each other.

The impedance matching section 230 may include a primary coil P and a secondary coil S. One end of the primary coil P is electrically connected to a connection node between the fourth P-channel MOS FET 221b and the third N-channel MOS FET 221c and receives one of the re-amplified signals, which has a positive level. The other end of the primary coil P is electrically connected to a connection node between the sixth P-channel MOS FET 222b and the fifth N-channel MOS FET 222c and receives the other one of the re-amplified signals, which has a negative level.

The secondary coil S may perform the impedance matching of the signals with positive and negative levels according to a turns ratio determined by electromagnetic coupling between the primary coil P and the secondary coil S to thereby transmit the impedance-matched signals to the amplification section.

The amplification section 240 may include third and fourth cascode amplification units 241 and 242 that are connected in series between the driving power terminal and ground and are connected in parallel with each other.

The third cascode amplification unit 241 may include seventh and eighth N-channel MOS FETs 241a and 241b that are connected in cascode configuration between the driving power terminal and ground. The fourth cascode amplification unit 242 may include ninth and tenth N-channel MOS FETs 242a and 242b that are connected in cascode configuration between the driving power terminal and ground.

Since the above-described cascode configuration is known in the art, a detailed description thereof will be omitted.

However, the seventh and ninth N-channel MOS FETs 241a and 242a have gates that receive the impedance-matched signals having positive and negative levels, respectively, while the eighth and tenth N-channel MOS FETs 241b and 242b have gates that receive gain control signals VCG to control the gain.

Figure 5:
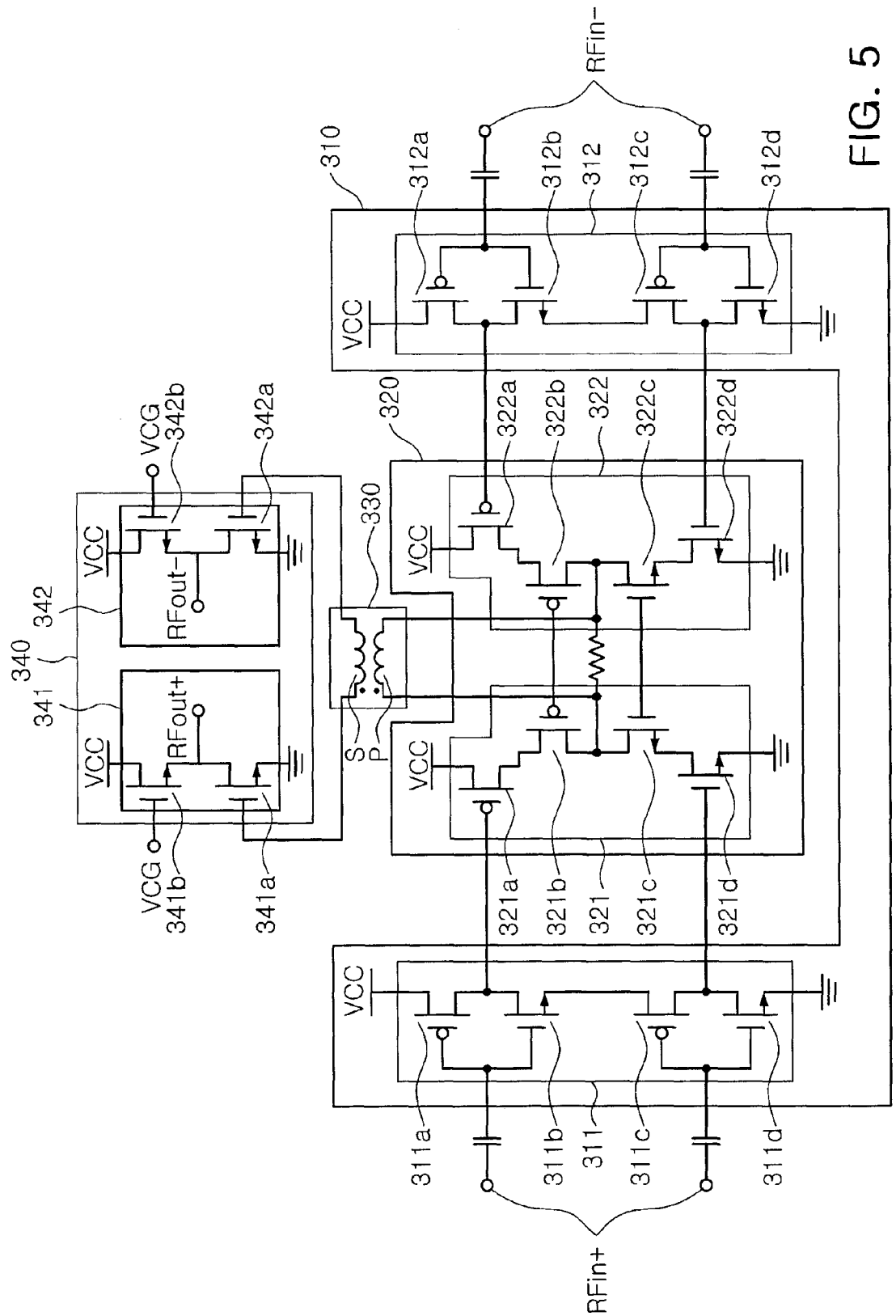
FIG. 5 is a schematic circuit diagram illustrating a power amplifier according to another exemplary embodiment of the present invention.

FIG. 5 is a schematic circuit diagram illustrating a power amplifier according to another exemplary embodiment of the invention.

Referring to FIGS. 4 and 5, the connections and configurations of an intermediate amplification section 320 having P-channel MOS FETs 321a, 321b, 322a, and 322, an impedance matching section 330 having N-channel MOS FETs 321c, 321d, 322c, 322d, 341a, 341b, 342a, and 342b, and an amplification section 340 having a primary coil P and a secondary coil S, which are included in a power amplifier according to this embodiment, are the same as those of the power amplifier, as shown in FIG. 4. Thus, a detailed description thereof will be omitted.

An inverter amplification section 310 may include a first inverter 311 and a second inverter 312. The first inverter 311 may include first and second inverter amplification units 311a, 311b, 311c, and 311d that are connected in series between the driving power terminal and ground. The second inverter 312 may include third and fourth inverter amplification units 312a, 312b, 312c, and 312d that are connected in series between the driving power terminal and ground.

The first inverter amplification sections 311a and 311b may include a first P-channel MOS FET 311a and a first N-channel MOS FET 311b, respectively. The second inverter amplification sections 311c and 311d may include a second P-channel MOS FET 311c and a second N-channel MOS FET 311d, respectively.

The third inverter amplification sections 312a and 312b may include a third P-channel MOS FET 312a and a third N-channel MOS FET 312b. The fourth inverter amplification sections 312c and 312d may include a fourth P-channel MOS FET 312c and a fourth N-channel MOS FET 312d.

An input signal RFin+ having a positive level, among RF input signals, may be input to the first and second inverter amplification units. An input signal RFin– having a negative level, among the RF input signals, may be input to the third and fourth inverter amplification units.

The input signal RFin+ having a positive level may be input to individual gates of the first P-channel MOS FET 311a, the first N-channel MOS FET 311b, the second P-channel MOS FET 311c, and the second N-channel MOS FET 311d. The input signal RFin– having a negative level may be input to individual gates of the third P-channel MOS FET 312a, the third N-channel MOS FET 312b, the fourth P-channel MOS FET 312c, and the fourth N-channel MOS FET 312d.

Furthermore, a source of the first N-channel MOS FET 311b may be connected to a drain of the second P-channel MOS FET 311c, and a source of the third N-channel MOS FET 312b may be connected to a drain of the fourth P-channel MOS FET 312c.

Since other connections, except for these connections, are similar with those of the inverter amplification section 110, as shown in FIG. 2, a detailed description thereof will be omitted.

As described above, according to the exemplary embodiments of the invention, an RF input signal is amplified according to an inverter method to remove DC components therefrom, thereby preventing power consumption caused by a DC signal, so that the efficiency of power, being consumed by a power amplifier, can be increased.

As set forth above, according to exemplary embodiments of the invention, power consumption caused by DC components of an RF input signal is prevented to thereby increase the power efficiency of a power amplifier.

While the present invention has been shown and described in connection with the exemplary embodiments, it will be apparent to those skilled in the art that modifications and variations can be made without departing from the spirit and scope of the invention as defined by the appended claims.

What is claimed is:

1. A power amplifier comprising:
an inverter amplification section configured to amplify AC components and remove DC components from at least one input signal, the inverter amplification section comprising:
at least one P-channel metal-oxide semiconductor field effect transistor (MOS FET) having a gate configured to receive the at least one input signal; and
at least one N-channel MOS FET having a gate configured to receive the at least one input signal, wherein the at least one P-channel MOS FET and the at least one N-channel MOS FET are serially connected;
an impedance matching section configured to match an impedance of a transmission path of the at least one input signal amplified by the inverter amplification section; and
an amplification section configured to amplify an impedance-matched signal from the impedance matching section according to a predetermined gain.

2. The power amplifier of claim 1, wherein the at least one input signal comprises balanced signals including an input signal having a positive level and an input signal having a negative level.

3. The power amplifier of claim 2, wherein the inverter amplification section comprises:
a first inverter including a first P-channel MOS FET having a source configured to receive a driving power, a gate configured to receive the input signal having the positive level, and a drain connected to the impedance matching section, and a first N-channel MOS FET having a drain connected to the impedance matching section and the drain of the first P-channel MOS FET, a gate configured to receive the input signal having the positive level, and a drain connected to a ground; and
a second inverter including a second P-channel MOS FET having a source being supplied with the driving power, a gate configured to receive the input signal having the negative level, and a drain connected to the impedance matching section, and a second N-channel MOS FET having a drain connected to the impedance matching section and the drain of the second P-channel MOS FET, a gate configured to receive the input signal having the negative level, and a source connected to the ground.

4. The power amplifier of claim 3, wherein the impedance matching section comprises:
a first primary coil having one end connected to the drain of the first P-channel MOS FET and the drain of the first N-channel MOS FET, the first primary coil being configured to receive the amplified input signal having the positive level from the first inverter;
a second primary coil having one end connected to the other end of the first primary coil and the other end connected to the drain of the second P-channel MOS FET and the drain of the second N-channel MOS FET, the second primary coil being configured to receive the amplified input signal having the negative level from the second inverter;
a first secondary coil having one end configured to receive an operating power and the other end connected to the amplification section, the first secondary coil electromagnetically coupled with the first primary coil and configured to couple to the input signal having the positive level from the first primary coil; and
a second secondary coil having one end configured to receive the operating power and the other end connected to the amplification section, the second secondary coil electromagnetically coupled with the second primary coil and configured to couple to the input signal having the negative level from the second primary coil.

5. The power amplifier of claim 4, wherein the amplification section comprises:
a third N-channel MOS FET having a drain being supplied with the driving power, a gate configured to receive the input signal having the positive level from the other end of the first secondary coil, and a source connected to the ground, the third N-channel MOS FET amplifying the input signal having the positive level from the impedance matching section according to the predetermined gain to thereby output the amplified input signal having the positive level; and
a fourth N-channel MOS FET having a drain being supplied with the driving power, a gate configured to receive the input signal having the negative level from the other end of the second secondary coil, and the source connected to the ground, the N-channel MOS FET amplifying the input signal having the negative level from the impedance matching section according to the predetermined gain to thereby output the amplified input signal having the negative level.

6. The power amplifier of claim 3, further comprising an intermediate amplification section configured to re-amplify the input signals amplified by the inverter amplification section according to at least another predetermined gain, and to transmit the input signals being re-amplified to the impedance matching section.

7. The power amplifier of claim 6, wherein the intermediate amplification section comprises:
   a first cascade amplification unit and a second cascade amplification unit each being supplied with the driving power from a driving power terminal, connected in parallel with each other, and configured to receive the input signal having the positive level and the input signal having the negative level from the inverter amplification section, respectively; and
   a first cascade amplification unit and a second cascade amplification unit respectively connected in series between the first and second cascade amplification units and a ground terminal, connected in parallel with each other, and configured to receive the input signal having the positive level and the input signal having the negative level from the inverter amplification section, respectively,
   the first cascade amplification unit comprises third and fourth P-channel MOS FETs, and the second cascade amplification unit comprises fifth and sixth P-channel MOS FETs, gates of the third and fifth P-channel MOS FETs are configured to receive the input signal having the positive level and the input signal having the negative level from the inverter amplification section, respectively, and the gate of the fourth P-channel MOS FET is connected in common to that of the sixth P-channel MOS FET, and
   the first cascade amplification unit comprises third and fourth N-channel MOS FETs, and the second cascade amplification unit comprises fifth and sixth N-channel MOS FETs, gates of the third and fifth N-channel MOS FETs are configured to receive the input signal having the positive level and the input signal having the negative level from the inverter amplification section, respectively, and the gate of the fourth N-channel MOS FET is connected in common to that of the sixth N-channel MOS FET.

8. The power amplifier of claim 7, wherein the impedance matching section comprises a primary coil having one end electrically connected to a connection terminal between the first cascade amplification unit and the first cascade amplification unit and the other end electrically connected to a connection terminal between the second cascade amplification unit and the second cascade amplification unit, the primary coil receiving the input signal being re-amplified by the intermediate amplification section; and a secondary coil electromagnetically coupled with the primary coil and receiving the input signal being re-amplified from the primary coil.

9. The power amplifier of claim 8, wherein the amplification section comprises:
   a third cascode amplification unit connected between the driving power terminal and the ground; and
   a fourth cascode amplification unit connected between the driving power terminal and the ground, the third and fourth cascode amplification units being connected in parallel with each other,
   the third cascode amplification unit comprises seventh and eighth N-channel MOS FETs, and the fourth cascode amplification unit comprises ninth and tenth N-channel MOS FETs, and gates of the seventh and ninth N-channel MOS FETs are configured to receive an external gain control signal, and gates of the eighth and tenth N-channel MOS FETs are configured to receive signals from the secondary coil of the impedance matching section.

10. The power amplifier of claim 2, further comprising an intermediate amplification section configured to re-amplify the input signals, amplified by the inverter amplification section, according to at least another predetermined gain, and to transmit the re-amplified input signals to the impedance matching section.

11. The power amplifier of claim 10, wherein the inverter amplification section comprises:
   a first inverter and a second inverter connected in series with each other between a driving power terminal supplying a driving power and a ground, the first and second inverters each configured to amplify the input signal having the positive level according to an inverter method and
   a third inverter and a fourth inverter connected in series between the driving power terminal and the ground, and configured to amplify the input signal having the negative level according to an inverter method,
   the first inverter comprises a first P-channel MOS FET having a source being supplied with the driving power, a gate configured to receive the input signal having the positive level, and a drain connected to the intermediate amplification section, the second inverter comprises a first N-channel MOS FET having a drain connected to the intermediate amplification section and the source of the first P-channel MOS FET, a gate configured to receive the input signal having the positive level, and a source connected to the ground, and
   the third inverter comprises a second P-channel MOS FET having a source being supplied with the driving power, a gate configured to receive the input signal having the negative level, and a drain connected to the intermediate amplification section, and the fourth inverter comprises a second N-channel MOS FET having a drain connected to the intermediate amplification section and the source of the second P-channel MOS FET, a gate configured to receive the input signal having the negative signal, and a source connected to the ground.

12. The power amplifier of claim 11, wherein the intermediate amplification section comprises:
   a first cascade amplification unit and a second cascade amplification unit each being supplied with the driving power from the driving power terminal and configured to receive the input signal having the positive level and the input signal having the negative level from the inverter amplification section, respectively; and
   a first cascade amplification unit and a second cascade amplification unit each being respectively connected between the first and second cascade amplification units and the ground terminal and configured to receive the input signal having the positive level and the input signal having the negative level from the inverter amplification section, respectively,
   the first cascade amplification unit comprises third and fourth P-channel MOS FETs, and the second cascade amplification unit comprises fifth and sixth P-channel MOS FETs, gates of the third and fifth P-channel MOS FETs are configured to receive the input signal having the positive level and the input signal having the negative level from the inverter amplification section, respectively, a gate of the fourth P-channel MOS FET is connected in common to that of the sixth P-channel MOS FET, and the first cascode amplification unit comprises third and fourth N-channel MOS FETs, and the second cascode amplification unit comprises fifth and sixth N-channel MOS FETs, gates of the third and fifth N-channel MOS FETs are configured to receive the input signal having the positive level and the input signal having the negative level from the inverter amplification section, respectively, a gate of the fourth N-channel MOS FET is connected in common to that of the sixth N-channel MOS FET.

13. The power amplifier of claim 12, wherein the impedance matching section comprises a primary coil having one end electrically connected to a connection terminal between the first cascade amplification unit and the first cascode amplification unit and the other end electrically connected to a connection terminal between the second cascade amplification unit and the second cascode amplification unit, the primary coil receiving the input signals re-amplified by the intermediate amplification section; and a secondary coil electromagnetically coupled with the primary coil and receiving the input signals being re-amplified from the primary coil.

14. The power amplifier of claim 13, wherein the amplification section comprises:
  a third cascode amplification unit connected between the driving power terminal and the ground; and
  a fourth cascode amplification unit connected between the driving power terminal and the ground, the third and fourth cascade amplification units being connected in parallel with each other,
  the third cascade amplification unit comprises seventh and eighth N-channel MOS FETs, and the fourth cascode amplification unit comprises ninth and tenth N-channel MOS FETs, and gates of the seventh and ninth N-channel MOS FETs are configured to receive an external gain control signal, and gates of the eighth and tenth N-channel MOS FETs are configured to receive signals from the secondary coil of the impedance matching section.

15. A power amplifier comprising:
  an inverter amplification section configured to receive a positive input signal and a negative input signal;
  an impedance matching section coupled to the inverter amplification section; and
  an amplification section coupled to the impedance matching section,
  the inverter amplification section comprising:
    a first inverter including:
      a first P-channel transistor having a source configured to receive a driving power, a gate configured to receive the positive input signal, and a drain connected to the impedance matching section, and
      a first N-channel transistor having a drain connected to the impedance matching section and the drain of the first P-channel transistor, a gate configured to receive the positive input signal, and a drain connected to a ground; and
    a second inverter including:
      a second P-channel transistor having a source configured to receive the driving power, a gate configured to receive the negative input signal, and a drain connected to the impedance matching section, and
      a second N-channel transistor having a drain connected to the impedance matching section and the drain of the second P-channel transistor, a gate configured to receive the negative input signal, and a source connected to the ground.

16. The power amplifier of claim 15, wherein the impedance matching section comprises:
  a first primary coil having one end connected to the drain of the first P-channel transistor and the drain of the first N-channel transistor;
  a second primary coil having one end connected to the other end of the first primary coil and the other end connected to the drain of the second P-channel transistor and the drain of the second N-channel transistor;
  a first secondary coil having one end configured to receive an operating power and the other end connected to the amplification section, the first secondary coil electromagnetically coupled with the first primary coil; and
  a second secondary coil having one end configured to receive the operating power and the other end connected to the amplification section, the second secondary coil electromagnetically coupled with the second primary coil.

17. The power amplifier of claim 16, wherein the amplification section comprises:
  a third N-channel transistor having a drain configured to receive the driving power, a gate coupled to the first secondary coil, and a source connected to the ground; and
  a fourth N-channel transistor having a drain configured to receive the driving power, a gate coupled to the second secondary coil, and the source connected to the ground.

18. A power amplifier comprising:
  an inverter amplification section configured to amplify a positive input signal and a negative input signal;
  an intermediate amplification section coupled to the inverter amplification section;
  an impedance matching section coupled to the intermediate amplification section; and
  an amplification section coupled to the impedance matching section.

19. The power amplifier of claim 18, wherein the inverter amplification section comprises:
  a first inverter and a second inverter connected in series with each other between a driving power terminal and a ground, the first and second inverters each configured to receive the positive input signal; and
  a third inverter and a fourth inverter connected in series between the driving power terminal and the ground, and configured to receive the negative input signal,
  the first inverter comprises a first P-channel transistor having a source coupled to the driving power terminal, a gate configured to receive the positive input signal, and a drain connected to the intermediate amplification section,
  the second inverter comprises a first N-channel transistor having a drain connected to the intermediate amplification section and the source of the first P-channel transistor, a gate configured to receive the positive input signal, and a source connected to the ground,
  the third inverter comprises a second P-channel transistor having a source coupled to the driving power terminal, a gate configured to receive the negative input signal, and a drain connected to the intermediate amplification section, and the fourth inverter comprises a second N-channel transistor having a drain connected to the intermediate amplification section and the source of the second P-channel transistor, a gate configured to receive the negative input signal, and a source connected to the ground.

20. The power amplifier of claim 19, wherein the intermediate amplification section comprises:
- a first cascade amplification unit and a second cascade amplification unit each being coupled with the driving power terminal and configured to respectively receive the positive input signal and the negative input signal via the inverter amplification section; and
- a first cascode amplification unit and a second cascode amplification unit each being respectively connected between the first and second cascade amplification units and the ground terminal and configured to respectively receive the positive input signal and the negative input signal via the inverter amplification section, the first cascade amplification unit comprises third and fourth P-channel transistors, and the second cascade amplification unit comprises fifth and sixth P-channel transistors, gates of the third and fifth P-channel transistors are coupled to the inverter amplification section, and a gate of the fourth P-channel transistor is connected with a gate of the sixth P-channel transistor, and the first cascode amplification unit comprises third and fourth N-channel transistors, and the second cascode amplification unit comprises fifth and sixth N-channel transistors, gates of the third and fifth N-channel transistors are coupled to the inverter amplification section, and a gate of the fourth N-channel transistor is connected with a gate of the sixth N-channel transistor.

* * * * *